(12) United States Patent
Lopez et al.

(10) Patent No.: US 8,178,959 B2
(45) Date of Patent: May 15, 2012

(54) PROCESS FOR FABRICATING A SEMICONDUCTOR COMPONENT SUPPORT, SUPPORT AND SEMICONDUCTOR DEVICE

(75) Inventors: Jerome Lopez, Grenoble (FR); Richard Remert, Saint Martin le Vinoux (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 226 days.

(21) Appl. No.: 12/633,724

(22) Filed: Dec. 8, 2009

(65) Prior Publication Data
US 2010/0148339 A1 Jun. 17, 2010

(30) Foreign Application Priority Data
Dec. 11, 2008 (FR) .................................. 08 58497

(51) Int. Cl.
*H01L 23/12* (2006.01)
(52) U.S. Cl. ................... 257/686; 257/E23.003; 29/831
(58) Field of Classification Search .................. 257/686, 257/E23.003; 174/260; 29/831
See application file for complete search history.

(56) References Cited

U.S. PATENT DOCUMENTS

| | | | |
|---|---|---|---|
| 6,381,141 B2 * | 4/2002 | Corisis et al. ................. | 361/735 |
| 6,469,374 B1 | 10/2002 | Imoto | |
| 6,472,735 B2 * | 10/2002 | Isaak ............................. | 257/686 |
| 7,365,416 B2 * | 4/2008 | Kawabata et al. ............ | 257/686 |
| 7,687,899 B1 * | 3/2010 | Berry ............................ | 257/687 |
| 2004/0262729 A1 | 12/2004 | Kumamoto | |
| 2006/0079020 A1 | 4/2006 | Omizo et al. | |
| 2006/0108676 A1 | 5/2006 | Punzalan, Jr. et al. | |
| 2007/0132093 A1 | 6/2007 | Chuang et al. | |
| 2007/0170571 A1 | 7/2007 | Gerber et al. | |
| 2007/0187810 A1 | 8/2007 | Mok et al. | |

OTHER PUBLICATIONS

Preliminary French Search Report, FR 0858497, dated Jul. 21, 2009.

* cited by examiner

*Primary Examiner* — Roy Potter
(74) *Attorney, Agent, or Firm* — Gardere Wynee Sewell LLP

(57) ABSTRACT

An electrical connection support for receiving a semiconductor component includes an electrical connection plate having electrical connection pads. A stand-off structure is provided over the electrical connection pads. The stand-off structure may include a supplementary layer provided on a zone of the electrical connection plate which includes the electrical connection pads of the plate and is outside of a place configured to receive a semiconductor component. The stand-off structure further includes electrical connection vias passing through the supplementary layer. These vias are electrically connected to the electrical connection pads of the plate and have outer faces for making external electrical connection (for example, to another electrical connection support in a stacked structure).

10 Claims, 3 Drawing Sheets

PROCESS FOR FABRICATING A SEMICONDUCTOR COMPONENT SUPPORT, SUPPORT AND SEMICONDUCTOR DEVICE

PRIORITY CLAIM

This application claims priority from French Application for Patent No. 08 58497 filed Dec. 11, 2008, the disclosure of which is hereby incorporated by reference.

TECHNICAL FIELD

The present invention relates to the field of semiconductor devices.

BACKGROUND

Semiconductor devices that comprise plates which bear on one side a semiconductor component, particularly integrated-circuit chips, and which are provided with electrical connection pads on the surface are known. It is also known to connect these electrical connection pads to electrical connection pads of other devices, also provided on the surface, so as to produce stacks.

SUMMARY

Embodiments herein provide a process for fabricating an electrical connection support intended to receive a semiconductor component.

This process comprises the production of electrical connection pads on a surface of an electrical connection plate, and the production of stand-off means comprising the production of a supplementary layer on a zone of said surface of the plate including said electrical connection pads of this plate and protruding from a place on said surface of the plate which is capable of receiving a semiconductor component, and the production of electrical connection vias through said supplementary layer, these being electrically connected to the electrical connection pads of the plate and having outer faces for external electrical connection.

The production of the stand-off means may comprise the deposition of at least one supplementary layer on said zone, the production of passages through said supplementary layer, which are located above said pads of the plate, and the filling of the passages of the supplementary layer with a material capable of forming said electrical connection vias on said pads of the plate.

The production of the stand-off means may comprise the production of a substrate having front pads, rear pads and electrical connection vias, which connect these front and rear pads, and the fastening of said substrate to said zone of the plate by electrically connecting its rear pads to the electrical connection pads of the plate.

The substrate may be fastened to the plate by a cement or adhesive.

The rear pads of the substrate and the electrical connection pads of the plate may be connected by an intermediate bonding material.

The process may comprise the production of openings in said face of the plate, these openings at least partially exposing said electrical connection pads of this plate.

Embodiments further provide an electrical connection support intended to receive at least one semiconductor component.

Such a support may comprise a plate having electrical connection pads on one surface, and stand-off means comprising a supplementary layer on top of one zone of said face and protruding from a place on this face which is capable of receiving at least one semiconductor component, and electrical connection vias formed through the supplementary layer, these being electrically connected to said electrical connection pads of the plate and having outer faces for external electrical connection.

The stand-off means may comprise a supplementary layer formed on said zone, passages through said supplementary layer, which are located above said electrical connection pads of the plate, and electrical connection vias made of a material at least partially filling said passages of the supplementary layer.

The plate may include openings at least partially exposing said electrical connection pads of this plate, said material at least partially filling these openings.

The stand-off means may comprise a substrate comprising front electrical connection pads, rear electrical connection pads and electrical connection vias connecting these rear pads to these front pads respectively, said substrate being fastened above said zone, the rear pads of the substrate being respectively connected to the electrical connection pads of the plate, the front pads of the substrate forming said outer faces for external electrical connection.

The substrate may be fastened to the plate by means of a cement or adhesive.

The plate may have openings at least partially exposing said electrical connection pads of this plate, the rear pads of the substrate and the electrical connection pads of the plate being connected by an intermediate bonding material.

Embodiments further provide a semiconductor device comprising a support and at least one semiconductor component mounted on said place of the plate of the support.

Embodiments further provide an assembly comprising a semiconductor device, another device comprising electrical connection pads and electrical connection means between the pads of the other device and said outer faces of the electrical connection vias of the stand-off means of the support.

The above electrical connection means may be balls.

BRIEF DESCRIPTION OF THE DRAWINGS

Various supports, devices and assemblies, together with methods of fabrication, will now be described by way of non-limiting examples and with reference to the drawing in which.

DETAILED DESCRIPTION OF THE DRAWINGS

Figure 1:
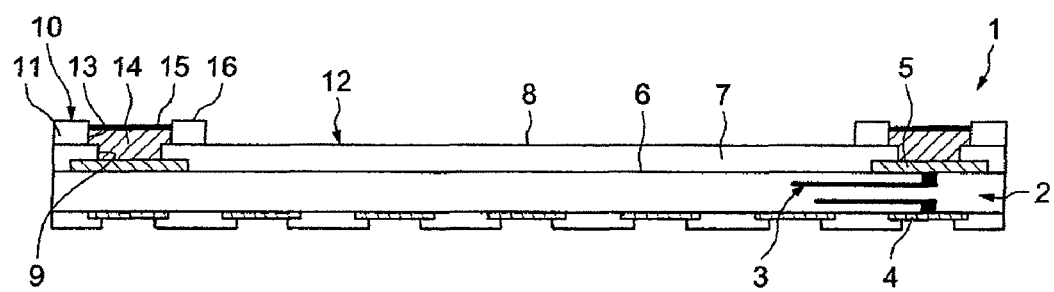
FIG. 1 shows a cross section through a semiconductor component support.
Figure 2:
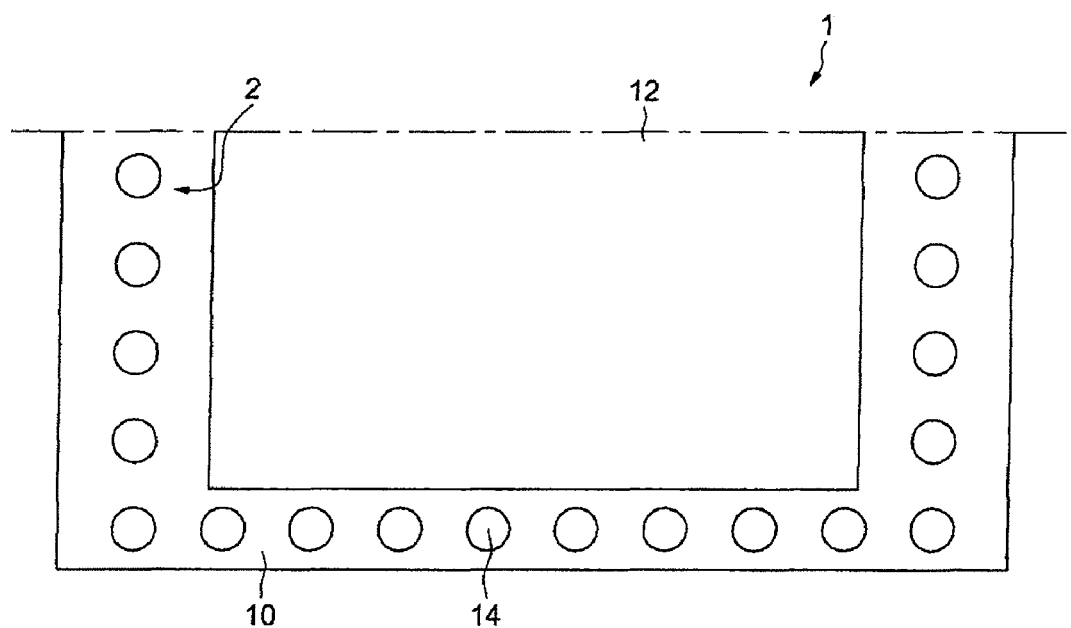
FIG. 2 shows a top view of the support of FIG. 1.

FIGS. 1 and 2 illustrate an electrical connection support 1 which comprises a plate 2 having an internal electrical connection network 3 that optionally and selectively connects rear electrical connection pads 4 provided in one face of the plate 2 and front electrical connection pads 5 provided in another face of the plate 2.

In the example shown, the plate 2 may have an anterior surface 6 on which the front pads 5 are formed and may include a dielectric surface layer 7, generally a lacquer resist, which covers the anterior surface 6 and forms a frontside 8. The surface layer 7 has openings 9 provided in the frontside 8 so as to expose the front pads 5 at least partially. The openings 9 may be circular and be provided so as to expose the central part of the pads 5. In an alternative embodiment, the frontside 8 of the surface layer 7 could be at the same level as the face of the front pads 5.

As an example, the front pads 5 and the corresponding openings 9 are placed on the periphery of the frontside 8 of the surface layer 7, at a certain distance from the peripheral edge of the plate 2.

The support 1 further includes frontside stand-off means 10.

These stand-off means 10 comprise a supplementary dielectric layer 11 which is locally bonded to the frontside 8 of the plate 2, on a zone of this frontside 8 in which the openings 9 and the front pads 5 of the plate 2 are provided and which outside of a central place 12 on the frontside 8.

In the example shown, the supplementary layer 11 extends in the form of a band over a peripheral zone of the frontside 8 of the plate 2, the central place 12 extending over a central part of the frontside 8. However, the supplementary layer 11 could have any other form matched to the disposition of the front pads 5 of the plate 2.

The supplementary layer 11 has through-passages 13 formed above the pads 4 of the plate 2. The through-passages 13 may be circular and of approximately the same diameter as those of the openings 9 in the surface layer 7 of the plate 2, preferably with slightly larger diameters than those of the openings 9.

The stand-off means 10 further include electrical connection vias 14 which are formed, on the front pads 5 of the plate 2, by a material which at least partially fills the openings 9 of the plate 2 and the through-passages 13 of the supplementary layer 11, these electrical connection vias 14 having frontsides 15 for the purpose of electrical connection to another device, which will be explained later.

The supplementary layer 11 and the electrical connection vias 14 may be fabricated by the usual means used in the microelectronics field. In particular, the electrical connection vias 13 may be obtained by the growth or chemical deposition or electrodeposition of one or more layers made of one or more suitable materials, for example metallic materials.

In the example shown, the frontsides 15 of the electrical connection vias 14 are set back relative to the frontside 16 of the supplementary layer 11. However, in other alternative embodiments, the frontsides 15 of the electrical connection vias 14 may be approximately level with or project from the frontside 16 of the supplementary layer 11.

According to the example shown, front pads 5 and corresponding electrical connection vias 14 are arranged in an annular row in the peripheral zone of the frontside 8 of the plate 2. Front pads 5 and corresponding electrical connection vias 14 could be arranged differently, possibly in several annular rows.

Figure 3:
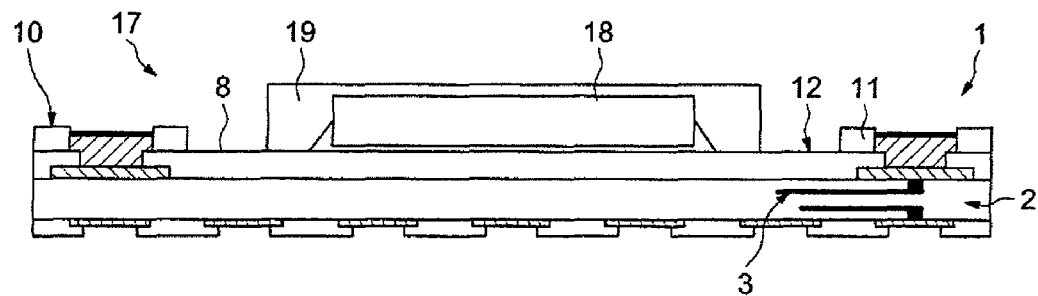
FIG. 3 shows a cross section through a semiconductor device.

FIG. 3 illustrates a semiconductor device 17 which comprises a support 1, such as the one described above, and which comprises, on the central place 12 of the frontside 8 of the plate 2, a semiconductor component 18 fastened to this frontside 8 and a parallelepipedal encapsulation block 19, encapsulating the semiconductor component 18 and its means (such as wire bonds or balls) for electrical connection to the electrical connection network 3 of the plate 2, the peripheral edge of the encapsulation block 19 and the inner peripheral edge of the supplementary layer 11 of the stand-off means 10 being a certain distance apart.

For example, the semiconductor component 18, such as an integrated-circuit chip, may be bonded to the frontside 8 of the plate 2 and may have frontside pads connected by electrical connection bond wires to front pads of the support plate, these being selectively connected to the internal electrical connection network 3. According to another example, the component 18 may be connected to front pads of the plate 2 by electrical connection balls interposed between them.

The placing of the semiconductor component 18 and the production of the encapsulation block 19 are preferably carried out after the stand-off means 10 have been produced.

For example, it is possible to produce, in the form of a wafer, a plurality of juxtaposed supports 2, then to install and electrically connect the semiconductor components 18 at their places 12, then to produce the encapsulation blocks 19 and finally to individualize the various semiconductor devices 17 thus fabricated, by sawing the wafer.

Figure 4:
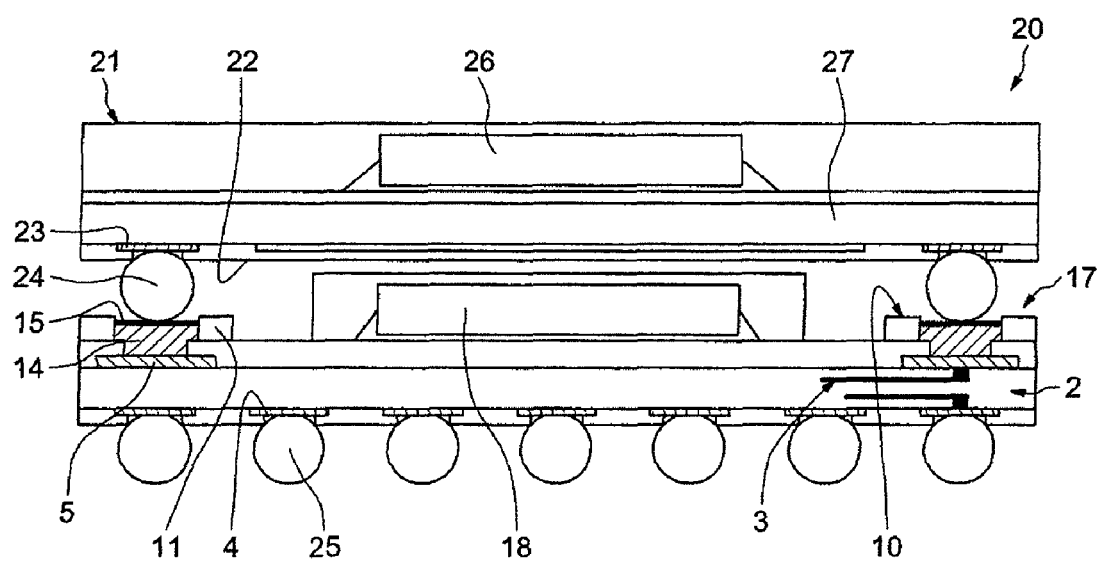
FIG. 4 shows a cross section through an assembly of the above semiconductor device and of another device.

FIG. 4 illustrates an assembly 20 comprising, for example, a semiconductor device 17 described above and another device 21 stacked on top of the semiconductor device 17 in the following manner.

The other device 21 has a rear face 22 passing over the top of the encapsulation block 19, at a certain distance therefrom, and having electrical connection pads 23 placed above the electrical connection vias 14 of the stand-off means 10 of the support 1.

Electrical connection balls 24 are interposed and bonded between the pads 23 of the other device 21 and the frontsides 15 of the electrical connection vias 14, so as to produce selective electrical connections between the other device 21 and the electrical connection network 3 of the plate 2 of the support 1.

Moreover, electrical connection balls 25 may be deposited on the rear pads 4 of the plate 2 of the support 1 for the external electrical connection of the assembly 20, for example to a printed circuit board.

For example, the other device 21 may comprise a semiconductor component 26 electrically connected to the pads 23 of said other device 21 via a support plate 27. However, the other device 21 could be of different constitution.

It follows from the foregoing that the semiconductor device 17 and the other device 21, stacked together, are connected by electrical connection stacks formed by the electrical connection vias 14 of the stand-off means 10 and by the balls 24.

For a given distance apart between the semiconductor device 17 and the other device 21, the existence of the stand-off means 10 makes it possible to reduce the diameter of the balls 24 compared to an arrangement in which the stand-off means 10 do not exist and in which the balls would be interposed directly between the front pads 5 of the plate 2 and the pads 23 of the other device 21. Thanks to the proposed arrangement, it is then possible, optionally, to increase the density of the front pads 5 of the plate 2 and consequently the number of connections between, for example, the semiconductor components 18 and 26 and/or the number of connections between, for example, the semiconductor component 26 and the outside, via the electrical connection network 3.

In an alternative embodiment, the supplementary layer 11 could be in contact with the rear face 22 of the other device 21. The balls 24 could then be replaced by drops of solder or of another electrical connection material. In another alternative embodiment, the frontsides 15 could be fastened to the pads 23 of the other device 20, either directly or via a suitable material. The thickness of the supplementary layer 11 would be adapted to the relative positions of the other device 20 and the semiconductor device 17.

Figure 5:
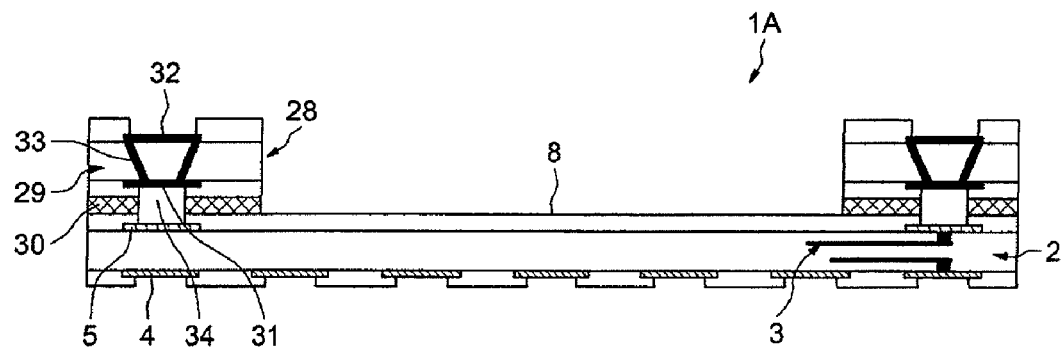
FIG. 5 shows a cross section through another semiconductor component support.

FIG. 5 illustrates a support 1A which also comprises a plate 2 and which comprises stand-off means 28 different from the stand-off means 10 described with reference to the previous figures.

The stand-off means 28 comprise a flat annular substrate 29 attached and bonded to a peripheral zone of the frontside 8 of the plate 2 via a layer of cement or adhesive 30, the flat annular substrate 29 forming a supplementary dielectric layer replacing the supplementary layer 11 of the previous example and being able to be attached for example to the same peripheral zone of the plate 2.

The flat annular substrate 29 comprises rear electrical connection pads 31 and front electrical connection pads 32 which are connected by electrical connection through-vias 33 placed on top of the electrical connection pads 5 of the plate 2. The connection pads 31 and 32 and the vias 33 are for example made of metal and fabricated using known microelectronics means.

The electrical connection pads 5 of the plate 2 and the rear pads 31 of the flat annular substrate 29 are electrically connected by intermediate drops 34 of solder, or other materials, through the adhesive 30. These drops 34 are put into place during mounting of the substrate 29 on the frontside 8 of the plate 2.

Figure 6:
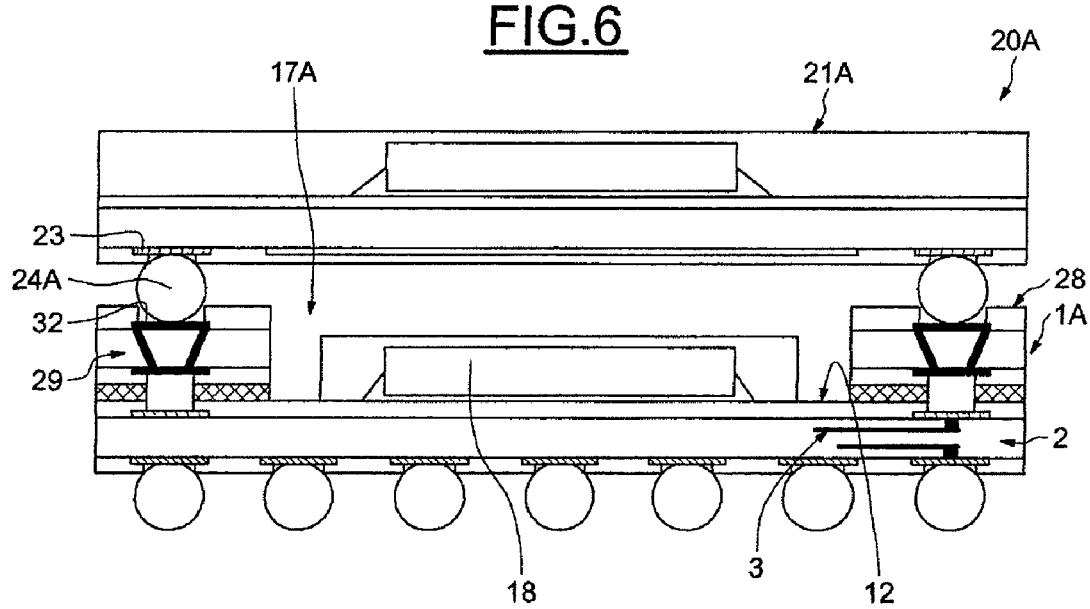
FIG. 6 shows a cross section through an assembly of the above semiconductor device and of another device.

FIG. 6 illustrates an assembly 20A, corresponding, both structurally and functionally, to the assembly 20 of FIG. 4.

This assembly 20A comprises a semiconductor device 17A comprising the support 1A and for example a semiconductor component 18 on its central place 12 formed on the inside of the flat annular substrate 29 of the stand-off means 28.

The assembly 20A further includes another device 21A, for example similar to the other device 20 of the previous example, which is placed on top of the semiconductor device 17A and is connected to the latter via electrical connection balls 24A interposed between the outer faces of the front pads 32 of the stand-off means 28 of the support 1A and the rear pads 23 of the other device 21A.

The substrate 29 of the stand-off means 28 that are placed on the plate 2 may allow the other device 21A of the stack 20A to be further away from the semiconductor device 17A, so as for example to improve extraction of the heat produced by the electronic components that they bear.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process, comprising:
   producing electrical connection pads on a surface of an electrical connection plate;
   producing a dielectric layer on the surface of the electrical connection plate; and
   producing a stand-off structure comprising a supplementary layer directly on a top surface of the dielectric layer above a zone of said surface of the electrical connection plate including said electrical connection pads, said zone being outside of a place on said top surface that is capable of receiving a semiconductor component;
   producing openings extending through said supplementary layer of the stand-off structure; and
   at least partially filling the openings to form electrical connection vias that are electrically connected to the electrical connection pads of the electrical connection plate and have outer faces for making external electrical connection.

2. A process, comprising:
   producing electrical connection pads on a surface of an electrical connection plate; and
   producing a stand-off structure comprising a supplementary layer on a zone of said surface of the electrical connection plate including said electrical connection pads which is outside of a place on said surface of the electrical connection plate that is capable of receiving a semiconductor component; and
   producing electrical connection vias through said supplementary layer of the stand-off structure, these vias being electrically connected to the electrical connection pads of the electrical connection plate and having outer faces for making external electrical connection;
   wherein producing the stand-off structure comprises:
      depositing the supplementary layer on said zone;
      producing passages through said supplementary layer which are located above said electrical connection pads of the electrical connection plate; and
      filling the passages of the supplementary layer with a material capable of forming said electrical connection vias to said electrical connection pads of the electrical connection plate.

3. A process, comprising:
   producing electrical connection pads on a surface of an electrical connection plate; and
   producing a stand-off structure comprising a supplementary layer on a zone of said surface of the electrical connection plate including said electrical connection pads which is outside of a place on said surface of the electrical connection plate that is capable of receiving a semiconductor component; and
   producing electrical connection vias through said supplementary layer of the stand-off structure, these vias being electrically connected to the electrical connection pads of the electrical connection plate and having outer faces for making external electrical connection;
   wherein producing the stand-off structure comprises:
      producing a substrate having front pads, rear pads and electrical connection vias, which connect the front pads to the rear pads; and
      fastening said substrate to said zone of the electrical connection plate by electrically connecting the rear pads to the electrical connection pads of the electrical connection plate; and
   wherein the substrate is fastened to the electrical connection plate by a cement or adhesive.

4. A process, comprising:
   producing electrical connection pads on a surface of an electrical connection plate; and
   producing a stand-off structure comprising a supplementary layer on a zone of said surface of the electrical connection plate including said electrical connection pads which is outside of a place on said surface of the electrical connection plate that is capable of receiving a semiconductor component; and
   producing electrical connection vias through said supplementary layer of the stand-off structure, these vias being electrically connected to the electrical connection pads of the electrical connection plate and having outer faces for making external electrical connection;
   wherein producing the stand-off structure comprises:

producing a substrate having front pads, rear pads and electrical connection vias which connect the front pads to the rear pads; and fastening said substrate to said zone of the electrical connection plate by electrically connecting the rear pads to the electrical connection pads of the electrical connection plate; and wherein the rear pads of the substrate and the electrical connection pads of the electrical connection plate are connected by an intermediate bonding material.

5. The process according to claim 1, further comprising producing openings in said dielectric layer, these openings in the dielectric layer at least partially exposing said electrical connection pads of the electrical connection plate, said openings in the dielectric layer filled in forming said electrical connection vias.

6. An electrical connection support configured to receive at least one semiconductor component, comprising:
    a plate having electrical connection pads on a surface;
    a dielectric layer on the surface of the plate, the dielectric layer having first openings to the electrical connection pads;
    a stand-off structure comprising a supplementary layer directly on a top surface of the dielectric layer over one zone of said surface and outside of a place on that surface which is configured to receive at least one semiconductor component, the supplementary layer including second openings coupled to the first openings; and
    electrical connection vias formed in the first and second openings, these vias being electrically connected to said electrical connection pads of the plate and having outer faces for external electrical connection.

7. The support according to claim 6, wherein the electrical connection vias are made of a conductive material filling said second openings and at least partially filling said first openings.

8. An electrical connection support configured to receive at least one semiconductor component, comprising:
    a plate having electrical connection pads on a surface;
    a stand-off structure comprising a supplementary layer on top of one zone of said surface and outside of a place on that surface which is configured to receive at least one semiconductor component; and
    electrical connection vias formed through the supplementary layer, these vias being electrically connected to said electrical connection pads of the plate and having outer faces for external electrical connection;
    wherein the stand-off structure comprises a substrate comprising front electrical connection pads, rear electrical connection pads and electrical connection vias connecting between the rear pads and the front pads, said substrate being fastened above said zone, the rear pads of the substrate being respectively connected to the electrical connection pads of the plate, the front pads of the substrate forming said outer faces for external electrical connection; and
    wherein the substrate is fastened to the plate by a cement or adhesive.

9. The support according to claim 8, wherein the plate has openings at least partially exposing said electrical connection pads of the plate, the rear pads of the substrate and the electrical connection pads of the plate being connected by an intermediate bonding material.

10. An assembly, comprising:
    a first semiconductor device including:
        a first support, comprising:
            a first plate having first electrical connection pads on a top surface;
            a stand-off structure comprising a supplementary layer on top of one zone of said top surface and outside of a place on that top surface which is configured to receive at least one semiconductor component; and
            electrical connection vias formed through the supplementary layer, these vias being electrically connected to said first electrical connection pads of the plate and having outer faces for external electrical connection; and
        at least one semiconductor component mounted on said place of the plate of the first support;
    a second semiconductor device, comprising:
        a second support, comprising:
            a second plate having second electrical connection pads on a rear surface; and
        at least one other semiconductor component mounted on the second plate; and
    electrical connections between the first electrical connection pads of the first support and the second electrical connection pads of the second support, wherein the electrical connections comprise the electrical connection vias of the stand-off structure;
    wherein the electrical connections further comprise electrical connection balls positioned between the electrical connection vias of the stand-off structure and the second electrical connection pads.

* * * * *

UNITED STATES PATENT AND TRADEMARK OFFICE
CERTIFICATE OF CORRECTION

PATENT NO. : 8,178,959 B2
APPLICATION NO. : 12/633724
DATED : May 15, 2012
INVENTOR(S) : Jérôme Lopez et al.

Page 1 of 1

It is certified that error appears in the above-identified patent and that said Letters Patent is hereby corrected as shown below:

On the Title Page:

Item (75), Inventors, please replace [Remert] with -- Rembert --.

Signed and Sealed this
Twenty-sixth Day of June, 2012

David J. Kappos
*Director of the United States Patent and Trademark Office*